United States Patent
Mateescu et al.

(10) Patent No.: US 12,362,029 B2
(45) Date of Patent: Jul. 15, 2025

(54) STUCK BITS ENCODING AND DECODING ON A STORAGE DEVICE

(71) Applicant: WESTERN DIGITAL TECHNOLOGIES, INC., San Jose, CA (US)

(72) Inventors: Robert Mateescu, San Jose, CA (US); Cyril Guyot, San Jose, CA (US); Ivana Djurdjevic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/389,155

(22) Filed: Nov. 13, 2023

(65) Prior Publication Data
US 2025/0157562 A1    May 15, 2025

(51) Int. Cl.
G11C 29/42    (2006.01)
(52) U.S. Cl.
CPC .................................. G11C 29/42 (2013.01)
(58) Field of Classification Search
None
See application file for complete search history.

(56) References Cited

U.S. PATENT DOCUMENTS

| 5,267,204 A | 11/1993 | Ashmore, Jr. |
| 10,528,419 B2 | 1/2020 | Davis |
| 10,679,718 B2 | 6/2020 | Ghaly |
| 11,403,169 B2 | 8/2022 | Fackenthal |

FOREIGN PATENT DOCUMENTS

KR    100330174 B1    3/2002

*Primary Examiner* — Guerrier Merant
(74) *Attorney, Agent, or Firm* — Barry IP Law, P.C.

(57) ABSTRACT

A storage device processes storage-free stuck bits information when writing and reading stored on the memory device. A controller encodes the data with cyclic error-correcting codes to generate a codeword and determines that a location in the memory device where codeword is be stored includes a stuck bit. Rather than storing the stuck bits information, when storing the codeword, the controller generates an encoding mask, adds the encoding mask to the codeword to generate encoded data, and stores the encoded data on the memory device. When reading the encoded data, the controller generates a list of decoding masks including the encoding mask, goes through the lists and adds a decoding mask to the encoded data. The controller decodes the encoded data with the encoding mask from the list and returns the data.

19 Claims, 10 Drawing Sheets

STUCK BITS ENCODING AND DECODING ON A STORAGE DEVICE

BACKGROUND

Non-volatile storage devices, such as solid-state drives (SSD) and the like, may include one or more memory devices for storing data and a controller for managing the internal operations of the storage device. Data may be stored on a series of memory cells organized into pages and blocks on the memory device. To write data to the memory device, the controller may send signals representing a binary bit (0 or 1) to program individual memory cells. In some cases, the memory device may be defective wherein a bit value may be stuck and cannot be changed. The value of a bit that cannot be changed may be referred to herein as a stuck bit value and the bit with the stuck bit value may be referred to herein as a stuck bit. For example, a stuck bit having a stuck bit value of 1 cannot be changed when the value of the bit is overwritten with a 0. A stuck bit may be caused by, for example, an electrical short, impurities in material, or other physical problems.

When the controller determines that there is a stuck bit in a location on the memory device where the controller is trying to write data, the controller may obtain side information about the stuck bit. The side information may include the location of the stuck bit and the stuck bit value. The controller may use the side information at the time of encoding original data into the memory device and the controller may manipulate the content of the original data being written to the memory device so that manipulated data being written to the location including the stuck bit corresponds with the stuck bit value. To properly decode the manipulated data and return the original data when the manipulated data is read from the memory device, the controller may store extra bits for the side information with the manipulated data. When the controller reads the manipulated data, the controller may use the extra bits generated for the side information to decode the manipulated data and recover the original data. Storage of the extra bits generated for the side information may burden the memory capacity and may require overprovisioning of the memory device.

SUMMARY

In some implementations, a storage device processes storage-free stuck bits information when writing data to a memory device and reading the data from the memory device. A controller on the storage device may encode the data with cyclic error-correcting codes to generate a codeword and determine that a location in the memory device where codeword is be stored includes a stuck bit. When storing the codeword, the controller generates an encoding mask, adds the encoding mask to the codeword to generate mask encoded data, and stores the mask encoded data on the memory device. A value in one or more bits in the mask encoded data is the same as a value in one or more stuck bits on the memory device; When reading the mask encoded data, the controller generates a list of decoding masks including the encoding mask, goes through the lists and adds a decoding mask to the mask encoded data. The controller decodes the mask encoded data with the encoding mask from the list and returns the data.

In some implementations, the storage device processes stuck bits information when writing data to a memory device and reading the data from the memory device. The storage device obtains an optimal number of decoding masks including the encoding mask using a solving engine. When reading the mask encoded data, the controller goes through a list including the optimal number of decoding masks and adds a decoding mask from the list to the mask encoded data, decodes the mask encoded data with the encoding mask from the list, and returns the data.

In some implementations, a method in a storage device is provided for processing storage-free stuck bits information when writing data to a memory device and reading the data from the memory device. The method includes encoding the data with cyclic error-correcting codes to generate a codeword and determining that a location in the memory device where codeword is be stored includes a stuck bit. The method also includes storing the codeword by generating an encoding mask, adding the encoding mask to the codeword to generate mask encoded data, and storing the mask encoded data on the memory device, wherein a value in one or more bits in the mask encoded data is the same as a value in one or more stuck bits on the memory device. The method further includes reading the mask encoded data by generating a list of decoding masks including the encoding mask, going through the lists and adding a decoding mask to the mask encoded data, decoding the mask encoded data with the encoding mask from the list, and returning the data.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations of the present disclosure.

The apparatus and method components have been represented where appropriate by conventional symbols in the drawings, showing those specific details that are pertinent to understanding the implementations of the present disclosure so as not to obscure the disclosure with details that will be readily apparent to those of ordinary skill in the art.

DETAILED DESCRIPTION OF THE INVENTION

The following detailed description of example implementations refers to the accompanying drawings. The same reference numbers in different drawings may identify the same or similar elements.

Figure 1:
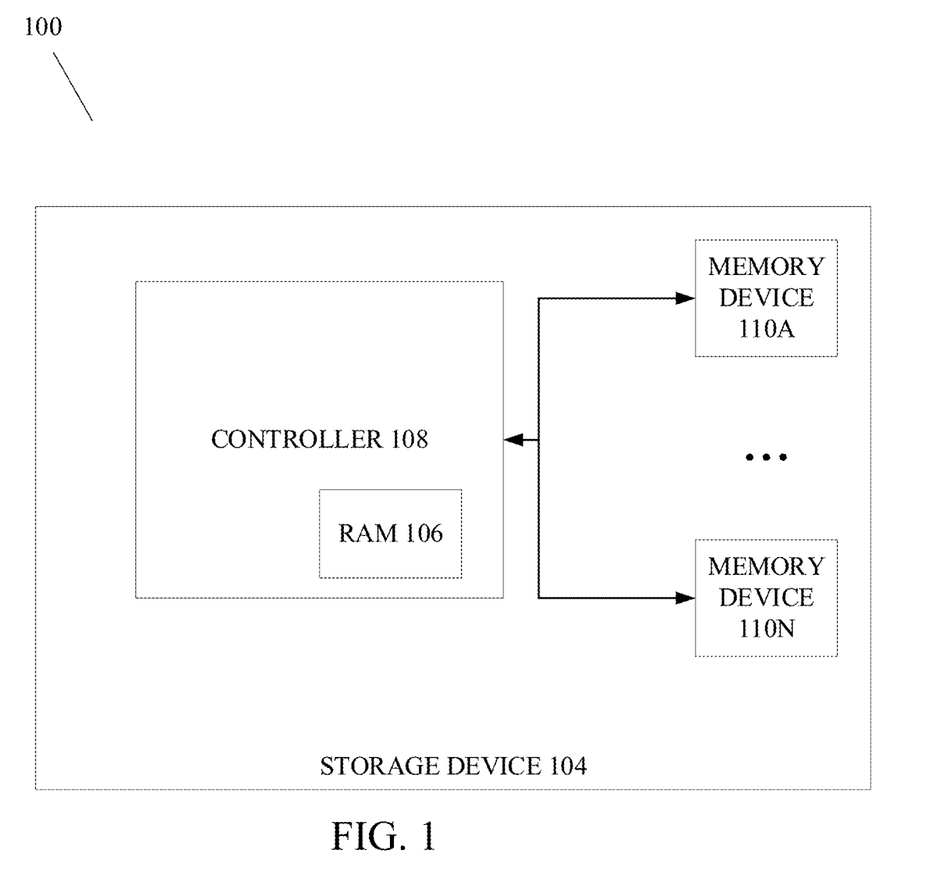
FIG. 1 is a schematic block diagram of an example storage device in accordance with some implementations.

FIG. 1 is a schematic block diagram of an example storage device in accordance with some implementations. Storage device 104 may include a random-access memory (RAM) 106, a controller 108, and one or more non-volatile memory devices 110a-110n (referred to herein as the memory device(s) 110). Storage device 104 may be, for example, a solid-state drive (SSD), and the like. RAM 106 may be temporary storage such as a dynamic RAM (DRAM) that may be used to cache information in storage device 104.

Controller 108 may interface with a host device and process foreground operations including instructions transmitted from the host device. For example, controller 108 may read data from and/or write to memory device 110 based on instructions received from the host device. Controller 108 may also execute background operations to manage resources on memory device 110. For example, controller 108 may monitor memory device 110 and may execute garbage collection and other relocation functions per internal relocation algorithms to refresh and/or relocate the data on memory device 110.

Memory device 110 may be flash based, a phase-change memory (PCM), or the like. Memory device 110 may be used for storing host and control data over the operational life of memory device 110. Memory device 110 may be divided into blocks and data may be stored in the blocks in various formats, with the formats being defined by the number of bits that may be stored per memory cell. For example, a single-layer cell (SLC) format may write one bit of information per memory cell, a multi-layer cell (MLC) format may write two bits of information per memory cell, a triple-layer cell (TLC) format may write three bits of information per memory cell, and a quadruple-layer cell (QLC) format may write four bits of information per memory cell, and so on. Formats storing fewer bits in each cell are more easily accessed, durable, and less error-prone than formats storing more bits per cell. However, formats storing fewer bits in each cell are also more expensive.

In some cases, memory device 110 may have defects in one or more cell locations and the bit stored in a defective location may be a stuck bit, wherein the value of the bit cannot be changed when it is overwritten with other data. In encoding, for example, host data (referred to herein as original data) on memory device 110, controller 108 may encode the original data with cyclic error-correcting codes. For example, controller 108 may encode the original data with Bose-Chaudhuri-Hocquenghem (BCH) codes. The BCH encoding process may add redundancy bits to the original data to correct random errors in the original data. If controller 108 determines that the location in memory device 110 where the original data is to be written includes one or more stuck bits, rather than adding extra bits for the stuck bit information to the original data and redundancy bits, controller 108 may generate a stuck bit mask. The vector of the stuck bit mask may be the same as that of the original data and redundancy bits. The stuck bit mask used to encode the original data may be referred herein as an encoding mask. Controller 108 may XOR the encoding mask to the original data and the redundancy bits to obtain mask encoded data. The mask encoded data may then be stored on memory device 110, wherein the value of one or more bits in the mask encoded data may be the same as to the values of the stuck bits in locations in memory device 110.

When controller 108 wants to retrieve the original data, controller 108 may execute a decoder, for example, a BCH decoder, to obtain the original data. Controller 108 may generate a list of stuck bit masks to be used in decoding the mask encoded data. The stuck bit masks generated for decoding may be referred to herein as decoding masks. The decoding masks may include the encoding mask. Controller 108 may pass the decoding masks to the BCH decoder. The BCH decoder may decode the mask encoded data with a decoding mask from the list, wherein only the encoding mask from the list of decoding masks may decode the mask encoded data to return the original data. Controller 108 may therefore trade extra decoding computations for storing the extra bits with the stuck bit information with the original data and the redundancy bits. Controller 108 may thus perform storage free stuck bit coding, i.e., controller 108 may store the original data and the redundancy bits without having to store extra bits for the stuck bit information and controller 108 may decode the mask encoded data without having to store the decoding masks.

In some implementations, controller 108 may obtain the stuck bit information, including the location of a stuck bit and the stuck bit value, from a self-reference read. In other implementations, controller 108 may discover the stuck bit information and apply stuck bit encoding during wear leveling and/or patrol scrub. Rather than storing extra bits for stuck bit(s) information with the original data and the redundancy bits, in some cases, controller 108 may execute a stuck bit scheme to dynamically generate encoding and decoding stuck bit masks. In other cases, controller 108 may find and store an optimal number of decoding masks to minimize the storage requirements associated with storing stuck bits information.

Consider an example where a BCH code may include n bits where n may be 1023 bits. 903 bits of those n bits may be used to store user data or payload, with the rest being used as redundancy bits added by the BCH code to protect against twelve random errors anywhere in the payload. The number of bits may be shortened to include a 520-bit payload with an additional 120 bits being assigned for redundancy by a BCH encoder, resulting in 640 bits. The remaining 383 bits that may not be used for payload and redundancy may be set to zeros and may not be stored in memory device 110. The shortened length may make the BCH encoded data more compatible with how memory device 110 may be organized and with, for example, the cache lines in memory device 110.

When controller 108 wants to store a BCH codeword including the payload and redundancy bits, controller 108 may determine whether one or two locations on memory device 110 where the BCH codeword is to be stored includes a stuck bit. If the BCH codeword is to be stored in a location on memory device 110 with one stuck bit, controller 108 may determine if the value of the bit in the BCH codeword to be stored in a stuck bit location is the same as the stuck bit value. If it is, controller 108 may store the BCH codeword on memory device 110. If the value of a bit in the BCH codeword to be stored in a stuck bit location is not the same as the stuck bit value, controller 108 may invert the BCH codeword so that the value of the bit in the BCH codeword to be stored in the stuck bit location is the same as the stuck bit value.

When controller 108 wants to read the original data in the BCH codeword, controller 108 may execute a first stuck bit scheme by generating a first mask including zeros and a second mask including ones. When controller 108 reads the BCH codeword, controller 108 may XOR the first mask to the BCH codeword. If the BCH decoder can decode the BCH codeword XORed with the first mask, controller 108 may determine that the data being read is the original data and controller 108 may return the data being read to, for example, a host device. If the BCH decoder cannot decode the BCH codeword XORed with the first mask, controller 108 may invert the data being read by XORing the data being read with the second mask. If the BCH decoder can decode the BCH codeword XORed with the second mask, controller 108 may determine that the data being read is the original data and controller may return the data being read. As such, rather than saving the extra bits for the stuck bit information with the payload and redundancy data, controller 108 may carry out two BCH decoding operations to obtain the original data when a memory location includes one struck bit.

When controller 108 determines that the BCH codeword being read from memory device 110 includes two stuck bits, controller 108 may execute a second stuck bit scheme to obtain the original data. Starting with a BCH codeword, for example, $c_1$, controller 108 may XOR with one of a predefined number of mask, e.g., $m_1$, such that $c_1 \oplus m_1$ is not a codeword. The mask may be the same length as the BCH codeword. By design if the masks are not codewords, then $c_1 \oplus m_1$ should not be another codeword. $c_1 \oplus m_1$ may be referred to herein as masked data. At decoding time, controller 108 may go through a list of masks and XOR other masks to $c_1 \oplus m_1$ until it encounters a mask that decodes $c_1 \oplus m_1$. The only mask in the list that should decode $c_1$ e $m_1$ should be $m_1$. The BCH decoder may thus identify which mask was used as $m_i \oplus m_j$ should not be a codeword.

Controller 108 may design the number of predefined masks to be as small as possible to avoid unnecessary computation during BCH decoding. As noted above, for a single stuck bit, the set of masks may be two, one with zeros and one with ones. For two stuck bits in two locations, controller 108 may build the list of masks algorithmically or controller 108 may build an optimal set of masks that cannot be regenerated algorithmically and store them on memory device 110. Controller 108 may generate a set of masks that is valid for any location in memory device 110, wherein for any two bits positions, i and j with stuck bits, there may exist four masks such that the bit values in positions i and j are respectively. 00, 01, 10, 11.

Using the example above where the BCH codeword is 640 bits, controller 108 may use a bit mask with a bit vector of size 640 and may XOR the bit mask and the BCH codeword. The XORed result should agree with the two stuck bits. In reading the data, controller 108 may obtain a list of masks and try masks in the same order until the BCH decoder can obtain the original data.

For two stuck bits, controller 108 may algorithmically build the list of masks used to execute the second stuck bit scheme via a linear scheme, a recursive scheme, or a generalized recursive scheme. In the linear scheme, when the length (n) of the data is greater than or equal to three, controller 108 may construct a solution with n+1 masks, with the first mask, $m_0$, being all zeros and masks $m_i$, i∈{1, . . . , n}, are all ones, except $m_i[i-1]=0$. For any two locations, i and j with stuck bits, there may be a mask generated such that the bit values in positions i and j are respectively. 00, 01, 10, 11. Depending on the size of the data, this set of masks may be large and may add latency and computed decode time to storage device 104. For example, when n is 640, the linear scheme may use 641 masks.

With the recursive scheme, controller 108 may generate a mask with all zeros and a mask with all ones to cover the 00 and 11 patterns. Controller 108 may check for the 01 and 10 patterns recursively for bit positions in different halves of a mask. The total number of masks generated for the recursive scheme for two stuck bits may be $2+2 \log_2 n$. Controller 108 may generate approximately twenty-two masks that may not need to be stored in memory device 110. These masks may be generated and sent to the BCH decoder during when decoding the BCH codeword.

With the generalized recursive scheme for two stuck bits, the number of masks generated for the recursive scheme may be optimized. Given a solution for covering B bits with M mask, controller 108 may build a solution for n bits. A first mask can be all zeros (XOR the first mask over all masks). The all zero mask may be applied once, then only the other m−1 are applied at every level, where:

$$\#\text{masks}(n) = 1 + (M-1) \cdot \log\_B \; n = 1 + \frac{M-1}{\log_2 B} \cdot \log_2 n$$

Controller 108 may also be provided with an optimal number of masks using, for example, a Satisfiability Problem (SAT) solver. The search for the optimal number of masks may be performed offline, one time, by formulating a Boolean formula in conjunctive normal form (CNF) and having the SAT solver generate a set of masks. Starting with a verified SAT solver solution for a number of bits, B=31, and the number of masks, M=8, with first mask all zeros (as above), controller 108 may apply the verified SAT solver a second time to obtain solution for n=31*31=961 and shorten to 640 bits. The second time controller 108 may need only seven masks (excluding the all-zeros mask). Hence for a 640-bit codeword, controller 108 may generate 15 (8+7) masks using the SAT solver.

Storage device 104 may perform these processes based on a processor, for example, controller 108 executing software instructions stored by a non-transitory computer-readable medium. As used herein, the term "computer-readable medium" refers to a non-transitory memory device. Software instructions may be read into the memory device from another computer-readable medium or from another device. When executed, software instructions stored in the memory device may cause controller 108 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 1 are provided as an example. In practice, storage device 104 may include additional components, fewer components, different components, or differently arranged components than those shown in FIG. 1. Additionally, or alternatively, a set of components (e.g., one or more components) of storage device 104 may perform one or more functions described as being performed by another set of components of storage device 104.

Figure 2:
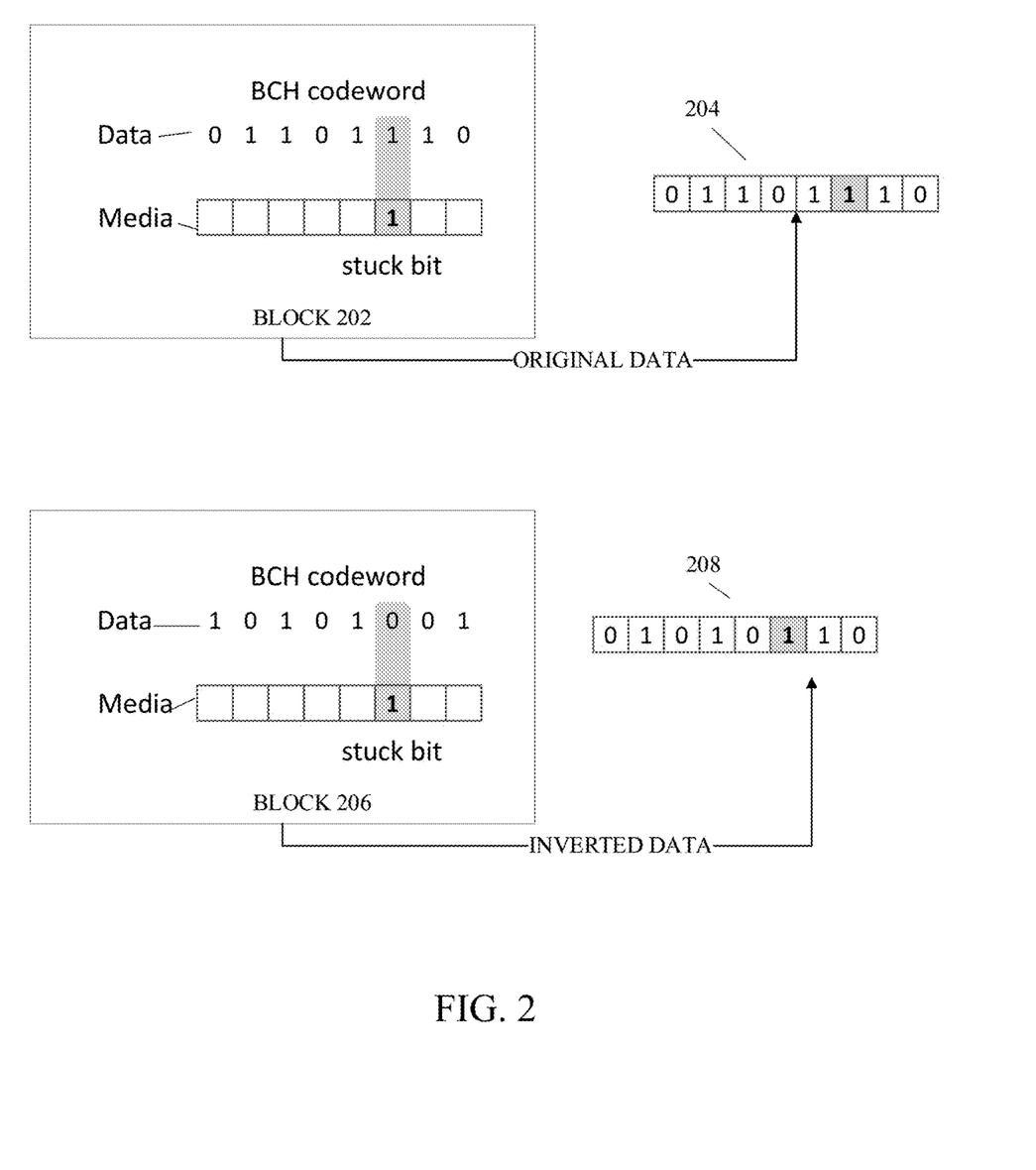
FIG. 2 shows an example where a first stuck bit scheme is executed using data inversion to obtain original data or inverted data in accordance with some implementations.

FIG. 2 shows an example where a first stuck bit scheme is executed using data inversion to obtain original data or inverted data in accordance with some implementations. Block 202 shows a BCH codeword including data and media on which the codeword may be stored. The media includes one stuck bit. The original data may be stored on the media because the data in the BCH codeword that is to be stored in a stuck bit location and the stuck bit value (both of which are shaded) are the same. 204 shows the original data stored in the media.

Block 206 also shows a BCH codeword including data and media including one stuck bit on which the codeword may be stored. The original data, i.e., the BCH codeword, may not be stored on the media because the data in the BCH codeword that is to be stored in a stuck bit location and the stuck bit value (both of which are shaded) are not the same. 208 shows the data stored in the media, wherein the data may be inverted to cause the inverted data in the BCH codeword that is to be stored in a stuck bit location to be the same as the stuck bit value.

During decoding, a mask of zeros may be applied to the data stored in 204 and 208. When the mask of zeros is applied to 204, the BCH decoder may successfully decode the data and return the original data. When the mask of zeros is applied to 208, the BCH decoder may not successfully decode the data. The BCH decoder may apply a mask of ones to the data in 208 to invert the data. The decoder may successfully decode the inverted data and may return the original data. As indicated above FIG. 2 is provided as an example. Other examples may differ from what is described in FIG. 2.

Figure 3:
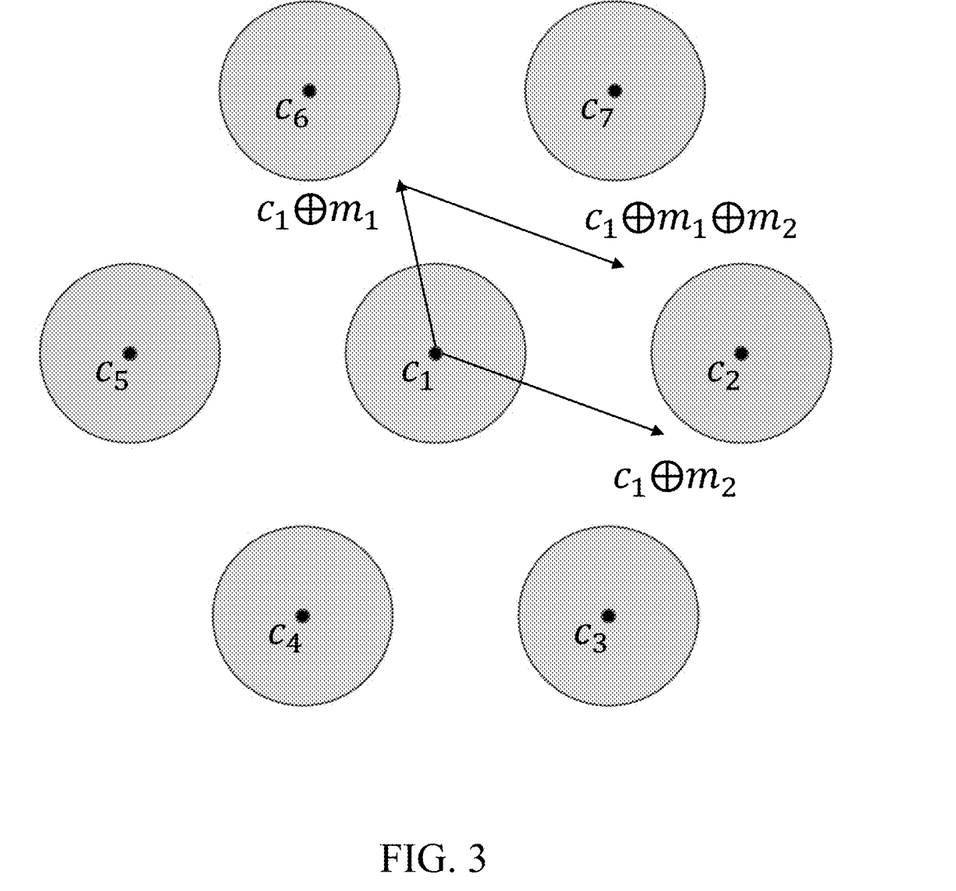
FIG. 3 shows an example of the geometry of how storage free coding may work in accordance with some implementations.

FIG. 3 shows an example of the geometry of how storage free coding may work in accordance with some implementations. Using an example where a BCH codeword may include a 520-bit payload, the combination of user data that may be stored may be $2^{520}$ distinct codewords in a space of $2^{640}$, representing the 520-bit payload and 120 redundancy bits. FIG. 3 shows the codewords as $c_i$ in the centers of a space, wherein the BCH code allows for a ball of radius twelve, twelve being the number of allowable errors that a BCH decoder may decode and correct to obtain the original data. The separation between any two codewords is satisfied so that the codewords do not intersect. Starting with a BCH codeword, for example, $c_1$, controller 108 may XOR one of a predefined number of mask, e.g., $m_1$, such that $c_1 \oplus m_1$ is not a codeword. The mask may be the same length as the BCH codeword, for this example, 640 bits. By design, if the masks are not codewords, then $c_1 \oplus m_1$ should not be another codeword and should not land in the ball of another codeword to avoid wrongly decoding to the other codeword.

At decoding time, controller 108 may go through a list of masks and XOR another mask to $c_1 \oplus m_1$. going through the list until it encounters a mask that decodes $c_1 \oplus m_1$. The only mask in the list that should decode $c_1 \oplus m_1$ should be $m_1$. The BCH decoder may thus identify which mask was used as $m_i \oplus m_j$ should not be a codeword.

The XOR of two masks can be assumed to be a random vector outside the codeword balls. The probability of uncorrectable error may decrease using this scheme while the probability of mis-correction may increase potentially by more than 15 orders of magnitude. The probability of mis-correction represents how likely it is to decode to the wrong a codeword ball after flipping up to 12 errors. To address this, approximately 4 bits may be needed to store and identify directly which mask was used $\log_2 15$. The extra bits may need protection. If a cyclic redundancy check (CRC) is used, that could identify if the right mask was used.

The 383 bits padded with zeros may be used for the extra bits. As indicated above FIG. 3 is provided as an example. Other examples may differ from what is described in FIG. 3.

Figure 4:
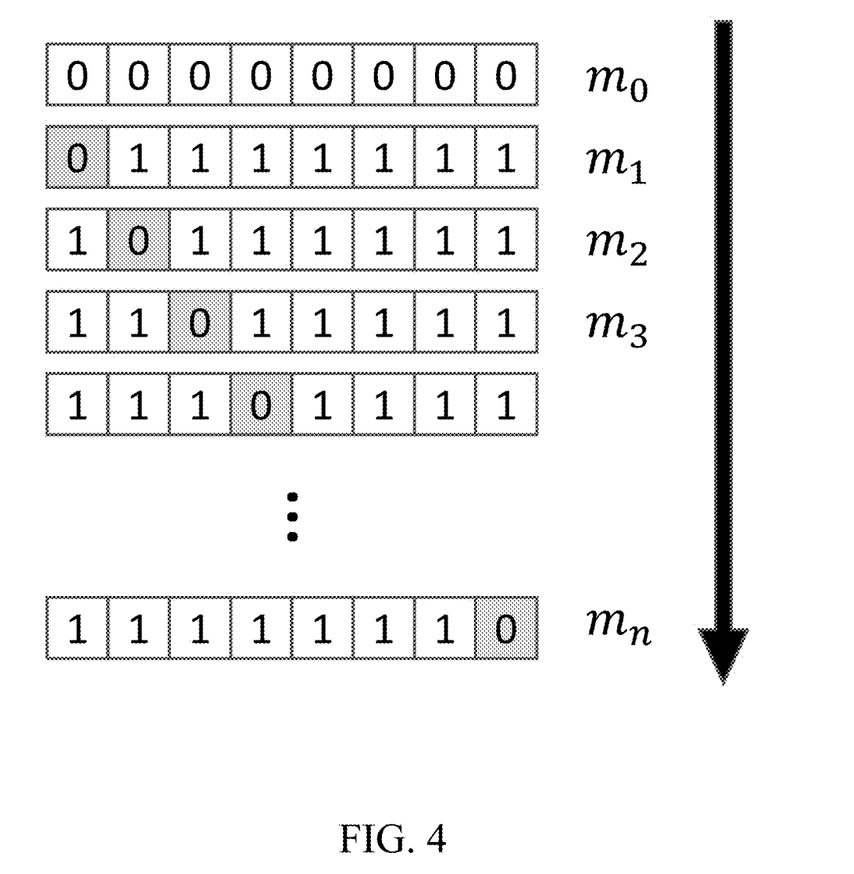
FIG. 4 shows an example of how masks may be generated using a linear scheme for a second stuck bit scheme is executed using a linear scheme to obtain original data in accordance with some implementations.

FIG. 4 shows an example of how masks may be generated using a linear scheme for a second stuck bit scheme is executed using a linear scheme to obtain original data in accordance with some implementations. When the size of the codeword (n) is greater than or equal to three, n+1 masks may be used in the linear scheme. Masks are tried in order from $m_0$ to $m_n$. The first mask, $m_0$, is all zeros. Masks $m_i$, $i \in \{1, \ldots, n\}$, are all ones, except $m_i[i-1]=0$. As indicated above FIG. 4 is provided as an example. Other examples may differ from what is described in FIG. 4.

Figure 5:
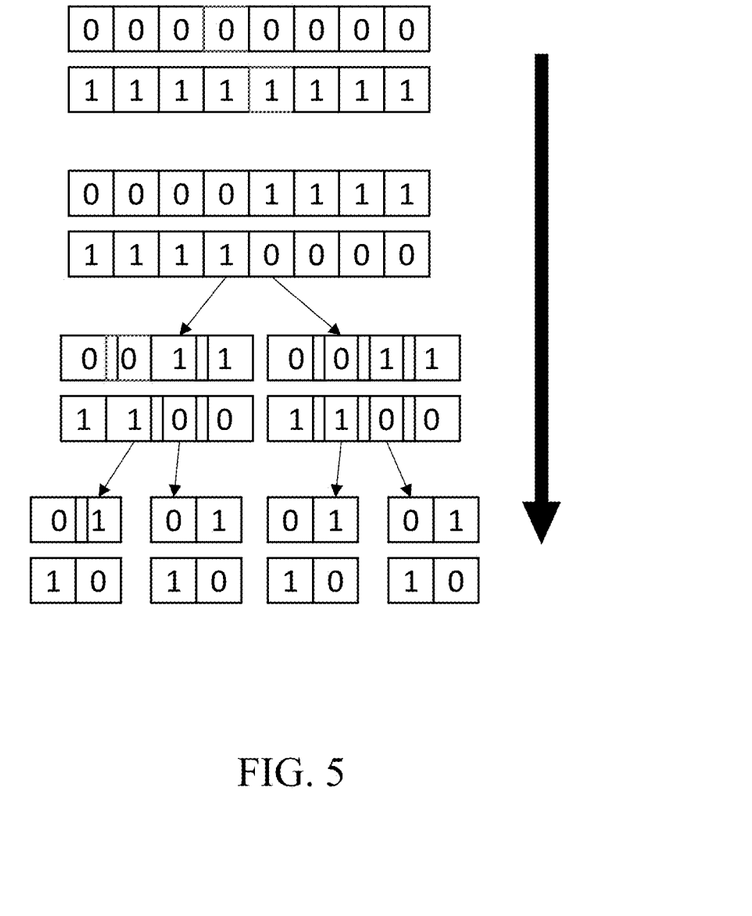
FIG. 5 shows an example where the second stuck bit scheme is executed using a recursive scheme to obtain original data in accordance with some implementations.

FIG. 5 shows an example where the second stuck bit scheme is executed using a recursive scheme to obtain original data in accordance with some implementations. The top two masks, including all zeros and all ones, may cover the 00, 11 patterns. The 01, 10 patterns may be checked recursively for bit positions in different halves of the masks. The total number of masks is $2+2 \log_2 n$. As indicated above FIG. 5 is provided as an example. Other examples may differ from what is described in FIG. 5.

Figure 6:
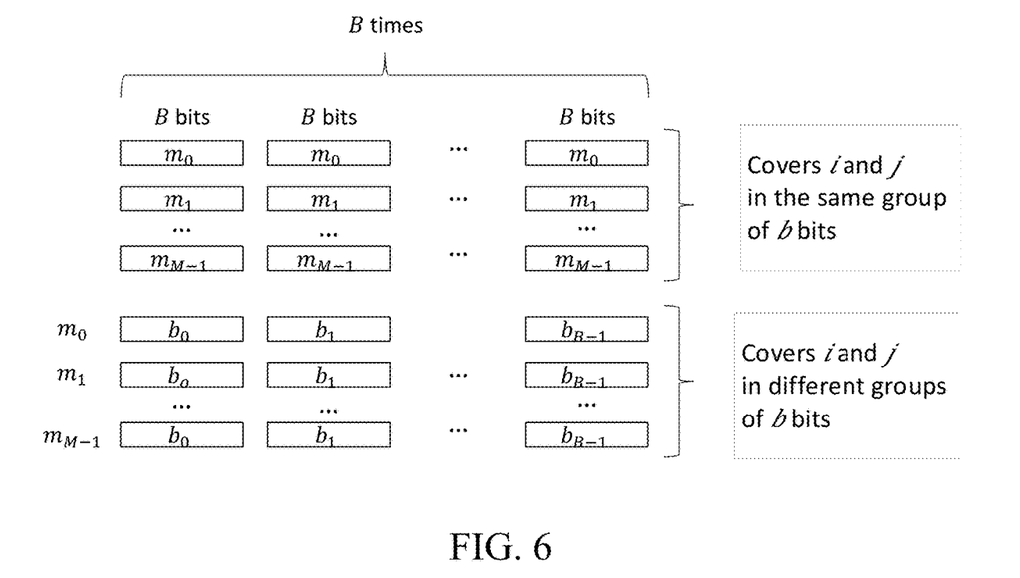
FIG. 6 shows an example where the second stuck bit scheme is executed using a generalized recursive scheme to obtain original data in accordance with some implementations.

FIG. 6 shows an example where the second stuck bit scheme is executed using a generalized recursive scheme to obtain original data in accordance with some implementations. Given a solution of M mask for B bits, a solution for n bits may be built. The first mask can be all zeros (XOR the first mask over all masks). The all zero mask may be applied once, then only the other m−1 are applied at every level, wherein $$\#masks(n) = 1 + (M-1) \cdot \lceil \log\_B, \rceil n = 1 + (M-1)/\log\_2 B \cdot \log\_2 n$$

As indicated above FIG. 6 is provided as an example. Other examples may differ from what is described in FIG. 6.

Figure 7:
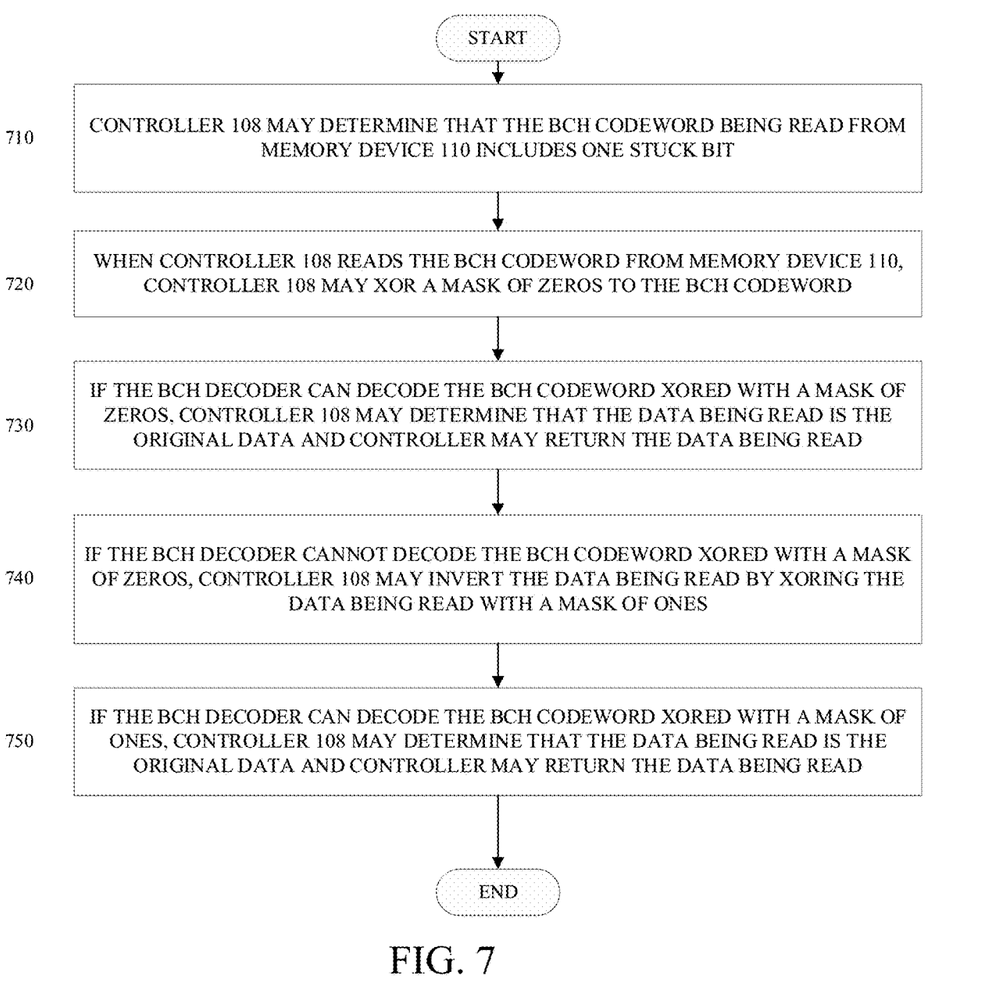
FIG. 7 is a flow diagram of an example process for executing a first stuck bit scheme to decode a BCH codeword in accordance with some implementations.

FIG. 7 is a flow diagram of an example process for executing a first stuck bit scheme to decode a BCH codeword in accordance with some implementations. At 710, controller 108 may determine that the BCH codeword being read from memory device 110 includes one stuck bit. At 720, when controller 108 reads the BCH codeword from memory device 110, controller 108 may XOR a mask of zeros to the BCH codeword. At 730, if the BCH decoder can decode the BCH codeword XORed with a mask of zeros, controller 108 may determine that the data being read is the original data and controller may return the data being read. At 740, if the BCH decoder cannot decode the BCH codeword XORed with a mask of zeros, controller 108 may invert the data being read by XORing the data being read with a mask of ones. At 750, if the BCH decoder can decode the BCH codeword XORed with a mask of ones, controller 108 may determine that the data being read is the original data and controller may return the data being read. As indicated above FIG. 7 is provided as an example. Other examples may differ from what is described in FIG. 7.

Figure 8:
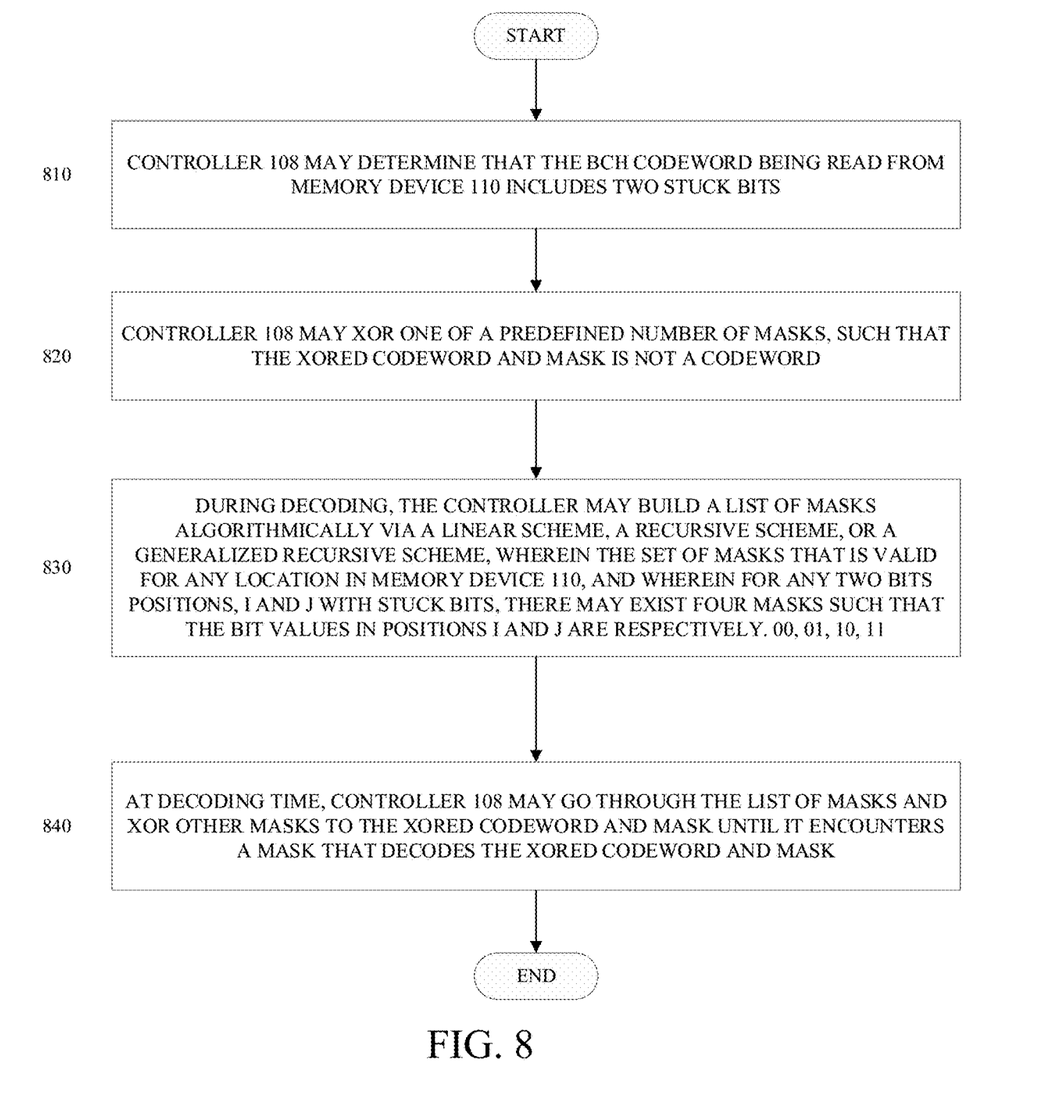
FIG. 8 is a flow diagram of an example process for executing a second stuck bit scheme to decode a BCH codeword in accordance with some implementations.

FIG. 8 is a flow diagram of an example process for executing a second stuck bit scheme to decode a BCH codeword in accordance with some implementations. At 810, controller 108 may determine that the BCH codeword being read from memory device 110 includes two stuck bits. At 820, controller 108 may XOR one of a predefined number of masks, such that the XORed codeword and mask is not a codeword. At 830, during decoding, the controller may build a list of masks algorithmically via a linear scheme, a recursive scheme, or a generalized recursive scheme, wherein the set of masks that is valid for any location in memory device 110, and wherein for any two bits positions, i and j with stuck bits, there may exist four masks such that the bit values in positions i and j are respectively. 00, 01, 10, 11. At 840, at decoding time, controller 108 may go through the list of masks and XOR other masks to the XORed codeword and mask until it encounters a mask that decodes the XORed codeword and mask. As indicated above FIG. 8 is provided as an example. Other examples may differ from what is described in FIG. 8.

Figure 9:
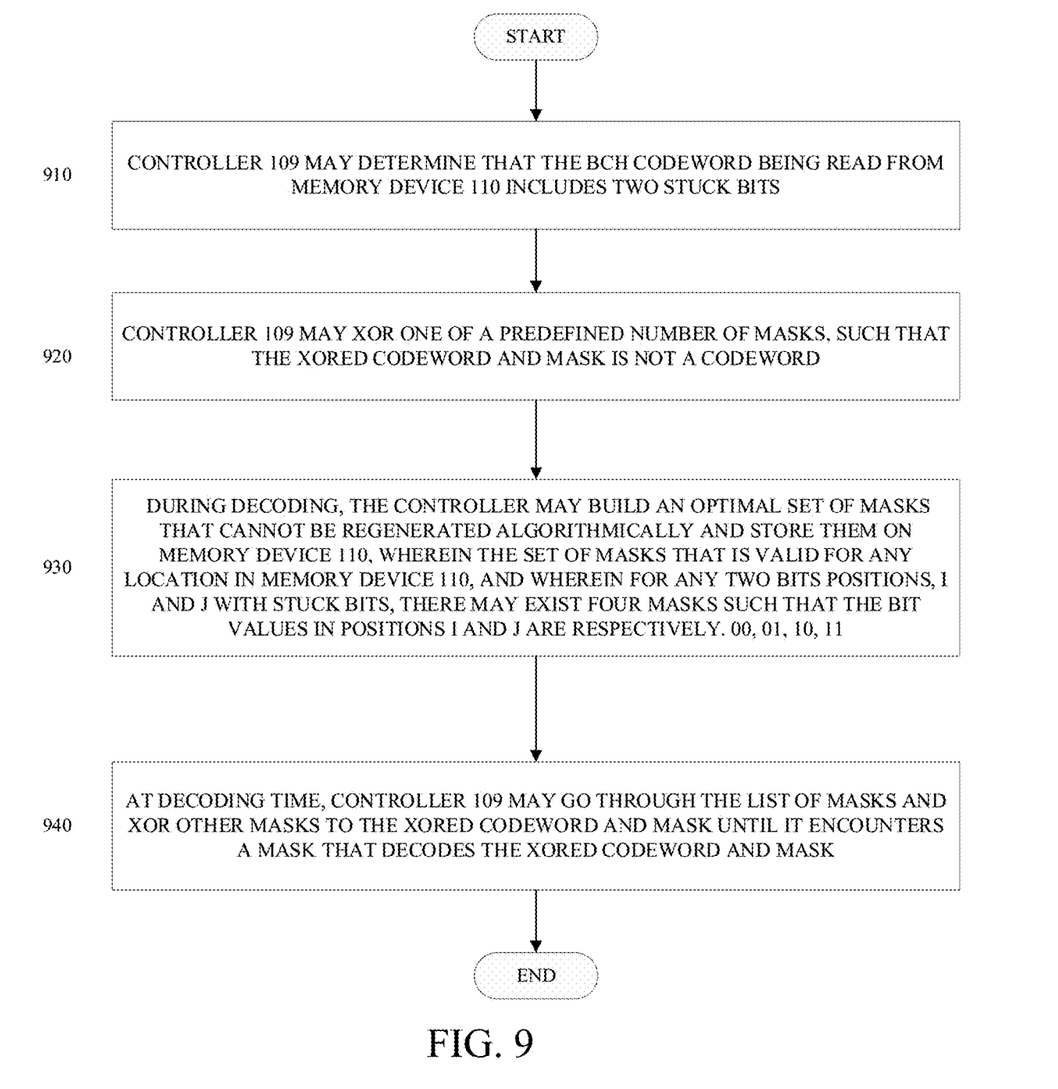
FIG. 9 is a flow diagram of another example process for executing the second stuck bit scheme to decode a BCH codeword by building on optimal set of masks in accordance with some implementations.

FIG. 9 is a flow diagram of another example process for executing the second stuck bit scheme to decode a BCH codeword by building on optimal set of masks in accordance with some implementations. At 910, controller 108 may determine that the BCH codeword being read from memory device 110 includes two stuck bits. At 920, controller 108 may XOR one of a predefined number of mask, such that the XORed codeword and mask is not a codeword. At 930, during decoding, the controller may build an optimal set of masks that cannot be regenerated algorithmically and store them on memory device 110, wherein the set of masks that is valid for any location in memory device 110, and wherein for any two bits positions, i and j with stuck bits, there may exist four masks such that the bit values in positions i and j are respectively. 00, 01, 10, 11. At 940, at decoding time, controller 108 may go through the list of masks and XOR other masks to the XORed codeword and mask until it encounters a mask that decodes the XORed codeword and mask. As indicated above FIG. 9 is provided as an example. Other examples may differ from what is described in FIG. 9.

Figure 10:
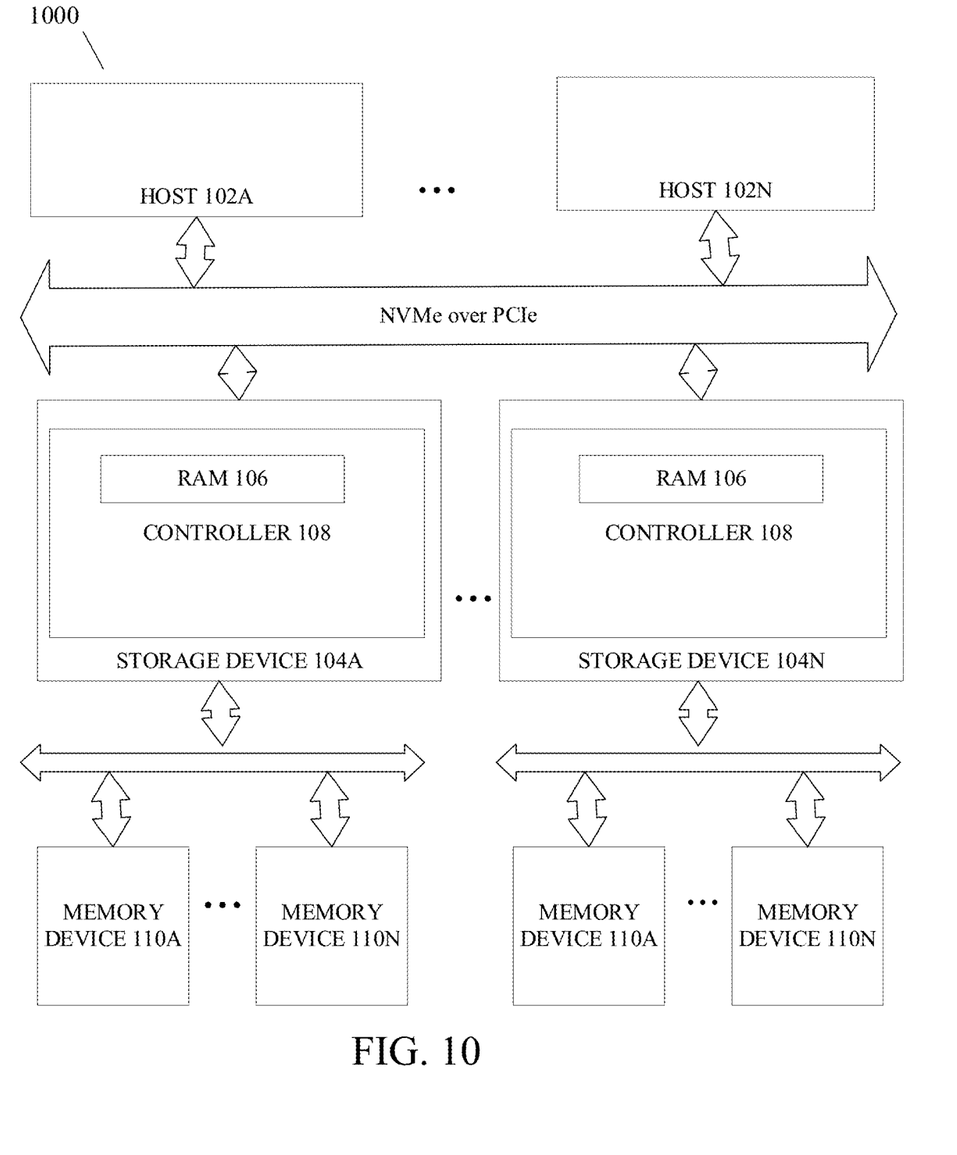
FIG. 10 is a diagram of an example environment in which systems and/or methods described herein are implemented.

FIG. 10 is a diagram of an example environment in which systems and/or methods described herein are implemented. As shown in FIG. 10, Environment 1000 may include hosts 102-102n (referred to herein as host(s) 102), and storage devices 104a-104n (referred to herein as storage device(s) 104).

Storage device 104 may include a controller 108 to process storage-free stuck bits information when writing data to memory device 110 and reading the data from memory device 110. Controller 108 may also process free stuck bits information by building an optimal number of decoding masks including an encoding mask using a solving engine. Hosts 102 and storage devices 104 may communicate via a Serial AT attachment (SATA) interface, Non-Volatile Memory Express (NVMe) over peripheral component interconnect express (PCI Express or PCIe) interface, the Universal Flash Storage (UFS) over Unipro, or the like.

Devices of Environment 1000 may interconnect via wired connections, wireless connections, or a combination of wired and wireless connections. For example, the network of FIG. 10 may include a cellular network (e.g., a long-term evolution (LTE) network, a code division multiple access (CDMA) network, a 3G network, a 4G network, a 5G network, another type of next-generation network, and/or the like), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 10 are provided as an example. In practice, there may be additional devices and/or networks, fewer devices and/or networks, different devices and/or networks, or differently arranged devices and/or networks than those shown in FIG. 10. Furthermore, two or more devices shown in FIG. 10 may be implemented within a single device, or a single device shown in FIG. 10 may be implemented as multiple, distributed devices. Additionally, or alternatively, a set of devices (e.g., one or more devices) of Environment 1000 may perform one or more functions described as being performed by another set of devices of Environment 1000.

The foregoing disclosure provides illustrative and descriptive implementations but is not intended to be exhaustive or to limit the implementations to the precise form disclosed herein. One of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of present teachings.

As used herein, the term "component" is intended to be broadly construed as hardware, firmware, and/or a combination of hardware and software. It will be apparent that systems and/or methods described herein may be implemented in different forms of hardware, firmware, and/or a combination of hardware and software.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Furthermore, as used herein, the term "set" is intended to include one or more items (e.g., related items, unrelated items, a combination of related items, unrelated items, and/or the like), and may be used interchangeably with "one or more." The term "only one" or similar language is used where only one item is intended. Further, the phrase "based on" is intended to mean "based, at least in part, on" unless explicitly stated otherwise.

Moreover, in this document, relational terms such as first and second, top and bottom, and the like, may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", or "contains . . . a" does not, without more constraints, preclude the existence of additional identical elements in the process, method, article, or apparatus that comprises, has, includes, contains the element. The terms "substantially", "essentially", "approximately", "about" or any other version thereof, are defined as being close to as understood by one of ordinary skill in the art, and in one non-limiting implementation, the term is defined to be within 10%, in another implementation within 5%, in another implementation within 1% and in another implementation within 0.5%. The term "coupled" as used herein is defined as connected, although not necessarily directly and not necessarily mechanically. A device or structure that is "configured" in a certain way is configured in at least that way but may also be configured in ways that are not listed.

We claim:

1. A storage device to process storage-free stuck bits information when writing data to a memory device and reading the data from the memory device, the storage device comprises:
   a controller to:
      encode the data with cyclic error-correcting codes to generate a codeword and determine that a location in the memory device where the codeword is to be stored includes a stuck bit;
      store the codeword, wherein in storing the codeword, the controller generates an encoding mask, adds the encoding mask to the codeword to generate mask encoded data, and stores the mask encoded data on the memory device wherein a value in one or more bits in the mask encoded data is the same as a value in one or more stuck bits on the memory device; and
      read the mask encoded data, wherein in reading the mask encoded data, the controller generates a list of decoding masks including the encoding mask, goes through the list and adds a decoding mask to the mask encoded data, decodes the mask encoded data with the encoding mask from the list, and returns the data.

2. The storage device of claim 1, wherein in storing the codeword, the controller determines that the location includes one stuck bit and one of:
   determines that a value of a bit in the codeword to be stored in a stuck bit location is the same as a stuck bit value, and the controller stores the codeword on the memory device, and
   determines that the value of the bit in the codeword to be stored in the stuck bit location is not the same as the stuck bit value, and the controller inverts the codeword and stores an inverted codeword on the memory device.

3. The storage device of claim 1, wherein in reading the mask encoded data the controller executes a first stuck bit scheme to obtain the data, wherein the controller reads the codeword, adds a first mask to the codeword, decodes the codeword, and if decoding of the codeword is successful, the controller returns the data, and
   if decoding the codeword added to the first mask is not successful, the controller adds a second mask to the codeword, decodes the codeword, and if decoding of the codeword is successful, the controller returns the data.

4. The storage device of claim 1, wherein in storing the codeword, the controller determines that the location includes two stuck bits, and the controller executes a second stuck bit scheme, wherein the controller adds one of a predefined number of masks to the codeword to generate the mask encoded data.

5. The storage device of claim 1, wherein in reading the mask encoded data, the controller generates a list of masks, and going through the list of masks, adds a mask to the mask encoded data until one mask from the list decodes the mask encoded data.

6. The storage device of claim 5, wherein the controller generates the list of masks algorithmically, wherein the list of masks is valid for any location in the memory device, wherein for any two bits positions, i and j with stuck bits, there may exist four masks such that bit values in positions i and j are respectively, 00, 01, 10, 11.

7. The storage device of claim 6, wherein the controller builds the list of masks used to execute a second stuck bit scheme via a linear scheme, wherein when a length (n) of the data is greater than or equal to three, the controller constructs a solution with n+1 masks, with a first mask, $m_0$, being all zeros and masks $m_i$, $i \in \{1, \ldots, n\}$, are all ones, except $m_i[i-1]=0$.

8. The storage device of claim 6, wherein the controller builds the list of masks used to execute a second stuck bit scheme via a recursive scheme, wherein the controller generates a first mask with all zeros and a second mask with all ones to cover a 00 pattern and a 11 pattern and the controller checks for a 01 pattern and a 10 pattern recursively for bit positions in different halves of the first and second masks.

9. The storage device of claim 6, wherein the controller builds the list of masks used to execute a second stuck bit scheme via a generalized recursive scheme to optimize a number of masks generated via a recursive scheme.

10. A storage device to process stuck bits information when writing data to a memory device and reading the data from the memory device, the storage device comprises:
    a controller to:
       encode the data with cyclic error-correcting codes to generate a codeword and determine that a location in the memory device where the codeword is to be stored includes a stuck bit;
       store the codeword, wherein in storing the codeword, the controller generates an encoding mask, adds the encoding mask to the codeword to generate mask encoded data, and stores the mask encoded data on the memory device wherein a value in one or more bits in the mask encoded data is the same as a value in one or more stuck bits on the memory device;
       obtain an optimal number of decoding masks including the encoding mask using a solving engine; and
       read the mask encoded data, wherein in reading the mask encoded data, the controller goes through a list including the optimal number of decoding masks and adds a decoding mask from the list to the mask encoded data, decodes the mask encoded data with the encoding mask from the list, and returns the data.

11. A method for processing storage-free stuck bits information in a storage device when writing data to a memory device and reading the data from the memory device, the storage device comprises a controller to perform the method comprising:
    encoding the data with cyclic error-correcting codes to generate a codeword and determining that a location in the memory device where the codeword is to be stored includes a stuck bit;
    storing the codeword by generating an encoding mask, adding the encoding mask to the codeword to generate mask encoded data, and storing the mask encoded data on the memory device, wherein a value in one or more bits in the mask encoded data is the same as a value in one or more stuck bits on the memory device; and
    reading the mask encoded data by generating a list of decoding masks including the encoding mask, going through the list and adding a decoding mask to the mask encoded data, decoding the mask encoded data with the encoding mask from the list, and returning the data.

12. The method of claim 11, wherein the storing comprises determining that the location includes one stuck bit and one of:
  determining that a value of a bit in the codeword to be stored in a stuck bit location is the same as a stuck bit value, and storing the codeword on the memory device, and
  determining that the value of the bit in the codeword to be stored in the stuck bit location is not the same as the stuck bit value, inverting the codeword and storing an inverted codeword on the memory device.

13. The method of claim 11, wherein the reading comprises executing a first stuck bit scheme to obtain the data by reading the codeword, adding a first mask to the codeword, decoding the codeword, and if decoding of the codeword is successful, returning the data, and
  if decoding the codeword added to the first mask is not successful, adding a second mask to the codeword, decoding the codeword, and if decoding of the codeword is successful, returning the data.

14. The method of claim 11, wherein the storing comprises determining that the location includes two stuck bits and executing a second stuck bit scheme by adding one of a predefined number of masks to the codeword to generate the mask encoded data.

15. The method of claim 11, wherein the reading comprises generating a list of masks, going through the list of masks, and adding a mask to the mask encoded data until one mask from the list decodes the mask encoded data.

16. The method of claim 15, further comprising generating the list of masks algorithmically, wherein the list of masks is valid for any location in the memory device, wherein for any two bits positions, i and j with stuck bits, there may exist four masks such that bit values in positions i and j are respectively, 00, 01, 10, 11.

17. The method of claim 16, further comprising building the list of masks used to execute a second stuck bit scheme via a linear scheme, wherein when a length (n) of the data is greater than or equal to three, the controller constructs a solution with n+1 masks, with a first mask, $m_0$, being all zeros and masks $m_i$, $i \in \{1, \ldots, n\}$, are all ones, except $m_i[i-1]=0$.

18. The method of claim 16, further comprising building the list of masks used to execute a second stuck bit scheme via a recursive scheme, wherein the controller generates a mask with all zeros and a mask with all ones to cover a 00 pattern and a 11 pattern and the controller checks for a 01 pattern and a 10 pattern recursively for bit positions in different halves of a mask.

19. The method of claim 16, further comprising building the list of masks used to execute a second stuck bit scheme via a generalized recursive scheme to optimize a number of masks generated via a recursive scheme.

* * * * *